(12) United States Patent
Scheuerlein

(10) Patent No.: US 6,522,594 B1
(45) Date of Patent: Feb. 18, 2003

(54) MEMORY ARRAY INCORPORATING NOISE DETECTION LINE

(75) Inventor: Roy E. Scheuerlein, Cupertino, CA (US)

(73) Assignee: Matrix Semiconductor, Inc., Santa Clara, CA (US)

(*) Notice: Subject to any disclaimer, the term of this patent is extended or adjusted under 35 U.S.C. 154(b) by 0 days.

(21) Appl. No.: 09/897,704

(22) Filed: Jun. 29, 2001

Related U.S. Application Data
(60) Provisional application No. 60/277,794, filed on Mar. 21, 2001, provisional application No. 60/277,815, filed on Mar. 21, 2001, and provisional application No. 60/277,738, filed on Mar. 21, 2001.

(51) Int. Cl.[7] .............................................. G11C 7/02
(52) U.S. Cl. ........................ 365/206; 365/51; 365/63; 365/105
(58) Field of Search ...................... 365/206, 94, 103, 365/104, 105, 175, 173, 171, 63, 51, 207, 225.7, 203

(56) References Cited

U.S. PATENT DOCUMENTS

| | | | |
|---|---|---|---|
| 4,646,266 A | | 2/1987 | Ovshinsky et al. ......... 365/105 |
| 5,535,156 A | * | 7/1996 | Levy et al. ................. 365/175 |
| 5,745,407 A | * | 4/1998 | Levy et al. ................. 365/159 |
| 5,751,012 A | | 5/1998 | Wolstenholme et al. ...... 257/5 |
| 5,835,396 A | | 11/1998 | Zhang .......................... 365/51 |
| 6,034,882 A | | 3/2000 | Johnson et al. ............. 365/103 |
| 6,055,180 A | | 4/2000 | Gudesen et al. ............ 365/175 |
| 6,185,121 B1 | * | 2/2001 | O'Neill ......................... 365/94 |
| 6,185,122 B1 | | 2/2001 | Johnson et al. ............. 365/103 |
| 6,185,143 B1 | * | 2/2001 | Perner et al. ............... 365/210 |
| 6,256,247 B1 | * | 7/2001 | Perner ......................... 365/209 |
| 6,351,406 B1 | * | 2/2002 | Johnson et al. ............. 365/103 |

OTHER PUBLICATIONS

U.S. App No. 09/775,956, filed Feb. 2, 2001, "Memory Array Organization and Related Test Method Particularly Well Suited for Integrated Circuits Having Write–Once Memory Arrays," inventor James M. Cleeves, 46 pp.

U.S. App. No. 09/897,785, filed Jun. 29, 2001, "Method And Apparatus For Writing Memory Arrays Using External Source Of High Programming Voltage," inventor Roy E. Scheuerlein, 68 pp.

U.S. App. No. 09/897,771, filed Jun. 29, 2001, "Method and Apparatus for Biasing Selected and Unselected Array Lines when Writing a Memory Array," inventor Roy E. Scheuerlein, 76 pp.

U.S. App. No. 09/897,705, filed Jun. 29, 2001, "Three–Dimensional Memory Array Incorporating Serial Chain Diode Stack," inventors Bendik Kleveland et al., 72 pp.

(List continued on next page.)

*Primary Examiner*—Huan Hoang
*Assistant Examiner*—Gene N. Auduong
(74) *Attorney, Agent, or Firm*—Zagorin, O'Brien & Graham, LLP

(57) ABSTRACT

A memory array includes a sensing circuit for sensing bit line current while keeping the voltage of the selected bit line substantially unchanged. The word lines and bit lines are biased so that essentially no bias voltage is impressed across half-selected memory cells, which substantially eliminates leakage current through half-selected memory cells. The bit line current which is sensed arises largely from only the current through the selected memory cell. A noise detection line in the memory array reduces the effect of coupling from unselected word lines to the selected bit line. In a preferred embodiment, a three-dimensional memory array having a plurality of rail-stacks forming bit lines on more than one layer, includes at least one noise detection line associated with each layer of bit lines. A sensing circuit is connected to a selected bit line and to its associated noise detection line.

51 Claims, 14 Drawing Sheets

OTHER PUBLICATIONS

U.S. App. No. 09/896,468, filed Jun. 29, 2001, "Current Sensing Method and Apparatus Particularly Useful for a Memory Array of Cells having Diode–Like Characteristics," inventor Roy E. Scheuerlein, 54 pp.

U.S. App. No. 09/560,626, filed Apr. 28, 2000, "Three–Dimensional Memory Array and Method of Fabrication," inventor Johan Knall, 48 pp.

U.S. App. No. 09/638,428, filed Aug. 14, 2000, "Low Cost Three–Dimensional Memory Array," inventors Mark G. Johnson et al., 25 pp.

U.S. App. No. 09/814,727, filed Mar. 21, 2001, "Three Dimensional Memory Array and Method of Fabrication," inventors Johan Knall and Mark G. Johnson, 49 pp.

U.S. App. No. 09/896,814, filed Jun. 29, 2001, "Memory Device with Row and Column Decoder Circuits Arranged in a Checkerboard Pattern Under a Plurality of Memory Arrays," inventor Roy E. Scheuerlein, 28 pp.

U.S. App. No. 09/895,960, filed Jun. 29, 2001, "Method and System for Increasing Programming Bandwidth in a Non–Volatile Memory Device," inventors Christopher S. Moore et al, 21 pp.

U.S. App. No. 09/896,815, filed Jun. 29, 2001, "Memory Device and Method for Sensing While Programming a Non–Volatile Memory Cell," inventors Bendik Kleveland et al., 26 pp.

U.S. App. No. 09/897,784, filed Jun. 29, 2001, "Method and Apparatus for Discharging Memory Array Lines," inventors Roy E. Scheuerlein and Matthew P. Crowley, 70 pp.

Peter K. Naji et al, "A 256kb 3.0V 1T1MTJ Nonvolatile Magnetoresistive RAM," 2001 IEEE International Solid–State Circuits Conference, Digest of Technical Papers, ISSCC 2001/Session 7/Technology Directions: Advanced Technologies/7.6, Feb. 6, 2001, pp. 122–123 (including enlargement of figures, totaling 9 pages), and associated Visual Supplement, pp. 94–95, 404–405 (enlargements of slides submitted, totaling 25 pages).

T, Kawahara et al., "Bit–Line Clamped Sensing Multiplex and Accurate High Voltage Generator for Quarter–Micron Flash Memories," IEEE Journal of Solid–State Circuits, vol. 31, No. 11, Nov. 1996, pp. 1590–1600.

\* cited by examiner

MEMORY ARRAY INCORPORATING NOISE DETECTION LINE

CROSS-REFERENCE TO RELATED APPLICATIONS

This application claims the benefit of the following U.S. provisional applications, each of which was filed on Mar. 21, 2001: U.S. Provisional Application No. 60/277,794; U.S. Provisional Application No. 60/277,815; and U.S. Provisional Application No. 60/277,738. Each of the above-referenced applications is hereby incorporated by reference.

BACKGROUND OF THE INVENTION

1. Field of the Invention

The present invention relates to high-density semiconductor memories, particularly those having memory cells exhibiting diode-like conduction characteristics, and more particularly, to a three-dimensional passive element memory array and support circuits useful therewith.

2. Description of Related Art

Three-dimensional cross-point memory arrays achieve high density, but also must deal with several attributes of such a dense structure. There is a large capacitance loading on both the word lines and bit lines, and significant capacitive coupling between such lines in the array. Moreover, particularly with memory cells (i.e., memory elements) that include diodes, there are frequently large leakage currents between unselected bit lines and unselected word lines within the array.

These characteristics make sensing a memory cell in the array more difficult. The large capacitance loading on a selected bit line delays the development of a voltage signal on the selected bit line, causing long sense delays. This is especially true in diode arrays because the current available from each memory cell is usually very small. The leakage current of half-selected cells (i.e., a cell having one of its terminals connected to a selected word or bit line and its other terminal connected to an unselected line) detracts from the signal on the selected bit line. Also, developing a signal on a particular bit line may couple noise into adjacent bit lines, which reduces the sensing margins available and detracts from reliable sensing.

Another characteristic of such a memory array structure is the coupling between a selected bit line and all the unselected word lines crossing over the selected bit line. Because the steering elements in such memory cells are diodes or some other highly asymmetric steering devices, the unselected word lines and unselected bit lines are frequently biased at voltages which impart a reverse bias voltage across the unselected memory cells. Leakage currents may consequently flow between the unselected bit lines and unselected word lines during sensing, and may result in small voltage perturbations on the unselected word lines. Even these small voltage variations may couple very strongly into the bit line being sensed, and make sensing more difficult.

All of these are especially problematic in high density, large capacity memory arrays because the fan out on the memory lines, particularly the bit lines, may be as large as 512 or more and the cell current is usually very small. The coupling capacitance between word lines and bit lines is particularly high in a memory array with a rail-stack structure that has an antifuse memory cell above and below each rail-stack cross-point. Such memory structures are described in U.S. Pat. No. 6,034,882 to Mark G. Johnson, et al., and U.S. patent application Ser. No. 09/560,626 by N. Johan Knall, filed Apr. 28, 2000 and the continuation-in-part thereof, U.S. patent application Ser. No. 09/814,727, filed on Mar. 21, 2001. Memory arrays having antifuse memory cells incorporating diode-like structures (either before or after programming) are significantly affected by these characteristics.

Currently, such memories are limited in their performance and may have lower internal signal margins which can potentially cause significant manufacturing difficulty. There remains a need for improved circuit structures and methods for sensing a memory cell in a high density memory array in which these undesirable characteristics are present.

SUMMARY OF THE INVENTION

An improved sensing method biases a selected bit line at a particular voltage, and the current through the selected memory cell is sensed while the selected bit line voltage is generally maintained at the particular voltage. In a preferred embodiment particularly suitable for an antifuse memory cell, the bias on a selected bit line is changed by 1 volt or more relative to its bias when previously unselected. The particular voltage for the selected bit line is preferably chosen to be substantially equal to the unselected word line voltage to substantially eliminate leakage current through half-selected memory cells on the selected bit line. By biasing the unselected word lines and bit lines in accordance with the invention, negligible leakage currents flow to or from the selected word line and bit line, and the bit line current which is sensed arises largely from only the current through the selected memory cell.

In other embodiments, the voltage clamped bit line sensing may be combined with a noise detection line in the memory array, to reduce the effect of coupling from unselected word lines to the selected bit line. In a preferred embodiment, a three-dimensional memory array having bit lines on more than one layer includes at least one noise detection line associated with each layer of bit lines. A sensing circuit is connected to a selected bit line and to its associated noise detection line.

In yet other embodiments, a noise detection line may be even more useful in memory arrays using voltage variation on the bit line sensing, rather than clamped bit line sensing. Different aspects of the invention may be advantageously used alone or in combination.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

DETAILED DESCRIPTION

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
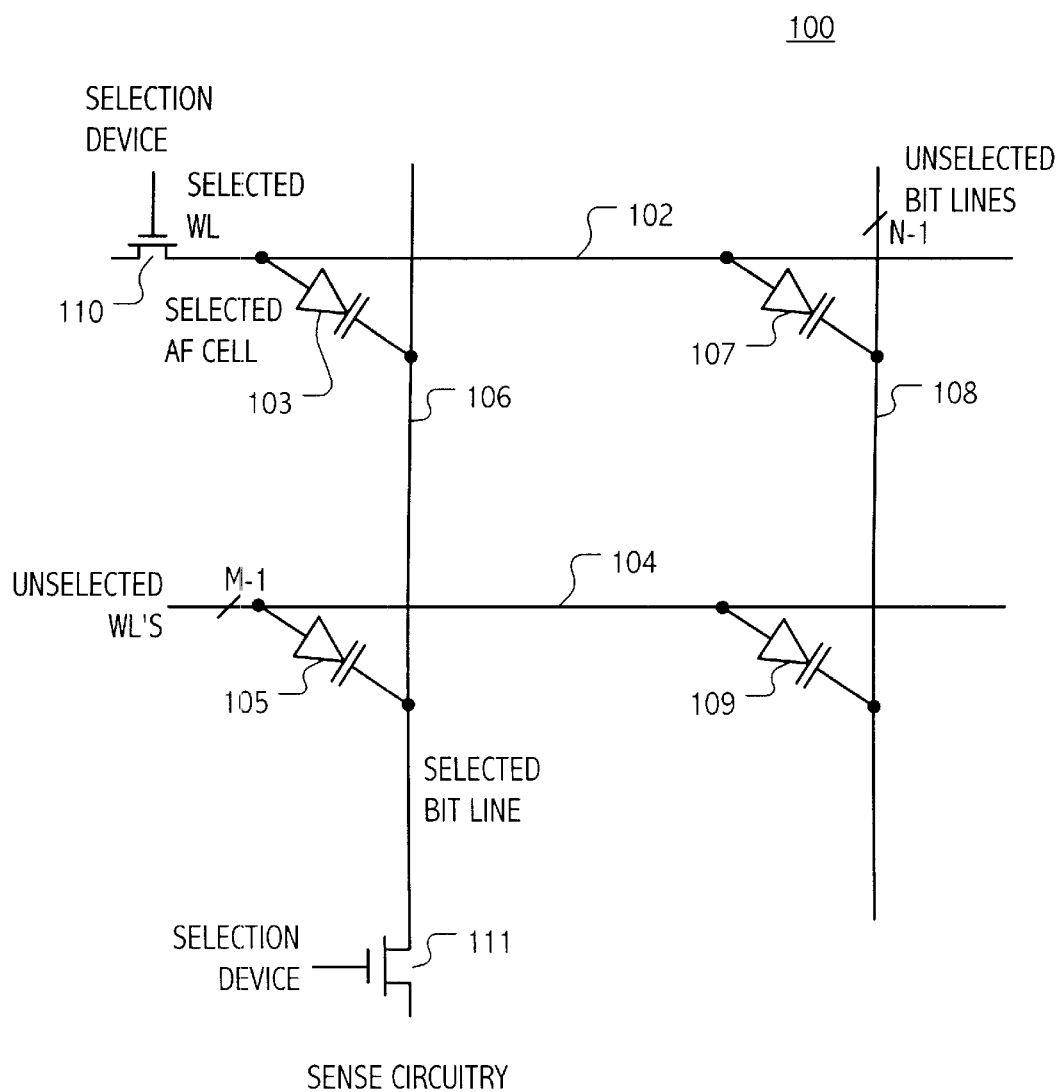
FIG. 1 is an electrical schematic diagram representing a diode stack-type memory array, showing a selected word line, a group of unselected word lines, a selected bit line, and a group of unselected bit lines.

Referring now to FIG. 1, one layer of a diode stack-type memory array 100 is depicted, showing a selected word line 102, a group of unselected word lines 104 (i.e., M−1 unselected word lines represented by a single line labeled 104), a selected bit line 106, and a group of N−1 unselected bit lines 108. In a preferred embodiment, the memory array 100 includes antifuse memory cells, although other types of passive element memory cells are contemplated. A selected memory cell 103 is shown coupled between the selected word line 102 and the selected bit line 106. A group of M−1 "half-selected" memory cells 105 is shown coupled between the unselected word lines 104 and the selected bit line 106. A group of N−1 "half-selected" memory cells 107 is shown coupled between the selected word line 102 and the unselected bit lines 108. Lastly, a group of (M−1)×(N−1) "unselected" memory cells 109 is shown coupled between the unselected word lines 104 and the unselected bit lines 108.

In a resting mode (i.e., an array inactive mode), all bit lines are preferably biased at a voltage at or near ground and all word lines are preferably biased at a voltage at or near ground. In a read standby mode, the unselected bit lines are precharged to a standby bias of +V, and the unselected word lines are biased to a reference voltage $V_{REF}$ (preferably about ⅓ $V_{DD}$). The +V voltage is then applied through a selection device 110 to the selected word line 102. Such a selection device 110 may take a variety of suitable forms, and may include a word line driver circuit configured to drive its associated word line to unselected and selected bias voltages during a read operation, and may also be configured to drive its word line to other voltages during other times. Useful word line circuits and configurations are described in "Three-Dimensional Memory Array Incorporating Serial Chain Diode Stack," by Kleveland, et al., U.S. patent application Ser. No. 09/897,705, which is being filed on the same day as the present application, and which is hereby incorporated by reference, and further described in "Memory Device with Row and Column Decoder Circuits Arranged in a Checkerboard Pattern under a Plurality of Memory Arrays," U.S. patent application Ser. No. 09/896,814, which is being filed on the same day as the present application, and which is hereby incorporated by reference.

Figure 2:
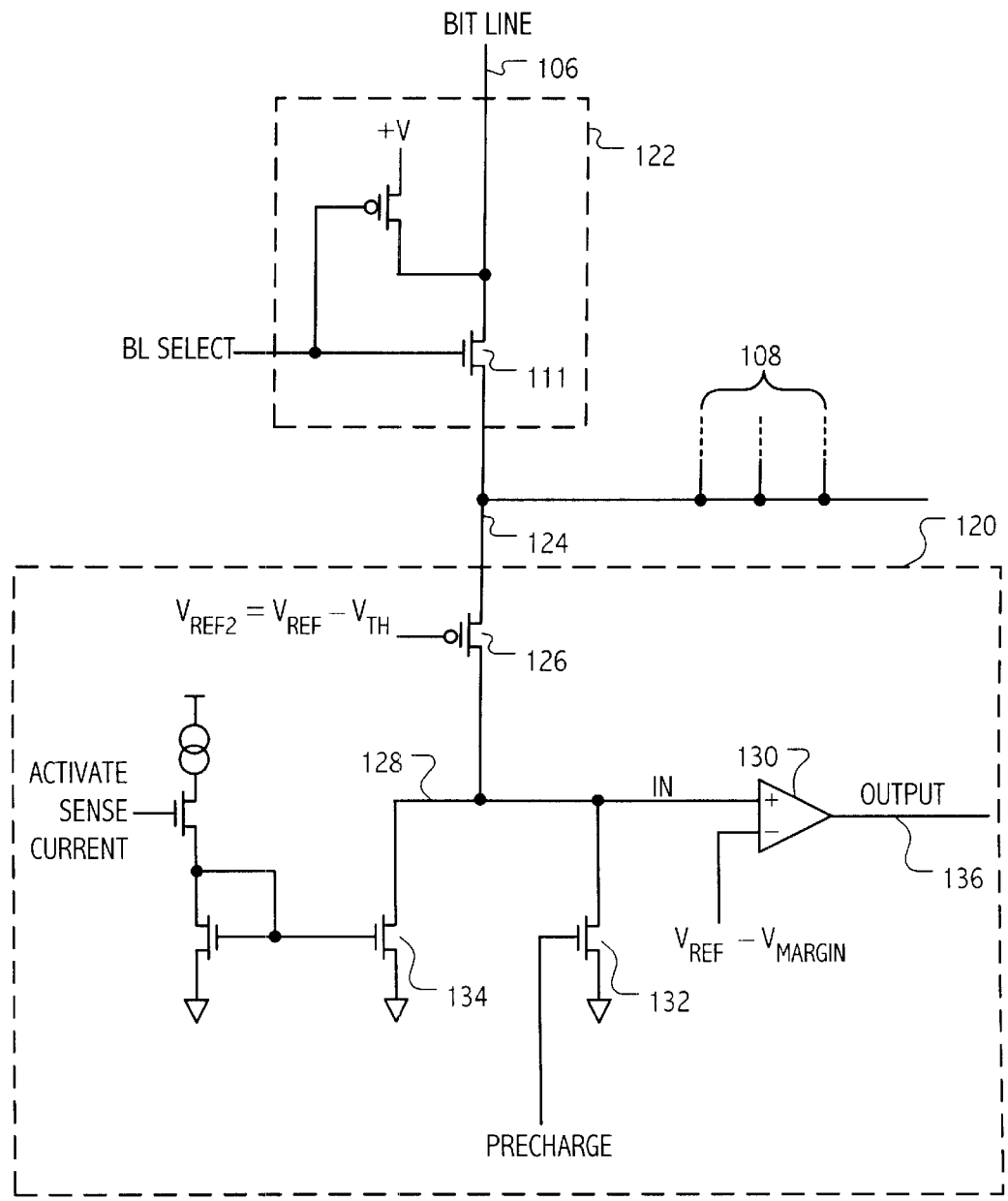
FIG. 2 is an electrical schematic diagram of a preferred embodiment of a bit line current sensing circuit useful for a diode stack-type memory array.

The selected bit line 106 is connected through a selection switch 111 to sense circuitry, not shown in FIG. 1. Such a selection switch 111 may take a variety of suitable forms, and may be implemented as a portion of a bit line driver circuit configured to also drive its associated bit line, when unselected, to an unselected read bias voltage, and to other voltages during other times. Referring now to FIG. 2, a suitable bit line driver 122 is shown which receives a BLSELECT signal, such as from a column decoder (not shown). When the BLSELECT signal is high, the driver 122 couples its associated bit line 106 to a common node 124 serving a group of bit lines, and when the BLSELECT is low, the driver 122 drives the bit line 106 to an unselected bit line bias voltage (here shown as the +V voltage). Other suitable bit line driver or switch circuits may be employed as well.

An implementation of a clamped bit line sense circuit 120 is also shown in FIG. 2. The selected bit line 106 is connected through the selection switch 111 to the common node 124 which forms an input node of the sense circuit 120. The bit line 106 is coupled to the drain of a PMOS clamp device 126 whose gate is coupled to a reference voltage $V_{REF2}$ equal to about a PMOS threshold below the unselected word line voltage (e.g., $V_{REF}$). The source of the clamp device 126 (node 128) is connected to an input of an amplifier circuit 130. Node 128 is pulled down below the unselected word line voltage $V_{REF}$ by a precharge control device 132. Since the gate of the clamp device 126 is a threshold voltage below $V_{REF}$, the selected bit line 106 falls to $V_{REF}$ by conduction through the clamp device 126, at which point the clamp device 126 turns off. This causes the selected memory cell to conduct a current that is determined by its data (programmed) state. Preferably a high conductance (corresponding to an programmed antifuse) is called a zero state, and a low conductance (corresponding to an unprogrammed antifuse) is called a one state. The precharge device 132 is then turned off and a current mirror device 134 is turned on which sinks a reference current from node 128 that is less than the current through a cell in a zero state. The current through the memory cell (if any) and the reference current are summed at node 128. If the cell current is greater than the reference current, node 128 rises quickly to the $V_{REF}$ voltage of the bit line 106. Alternatively, if the cell current is less than the reference current, the node 128 stays at or near its precharged level and well below the selected bit line 106 voltage. Node 128 thus rises to or falls well below the $V_{REF}$ voltage depending on the memory cell state, and does so without any substantial voltage change on the selected bit line 106. The amplifier 130 compares the voltage of node 128 (also labeled "IN") to a reference level $V_{REF}-V_{MARGIN}$ and produces an output signal on an output node 136. The magnitude of $V_{MARGIN}$ is preferably 200–400 mV.

Figure 3:
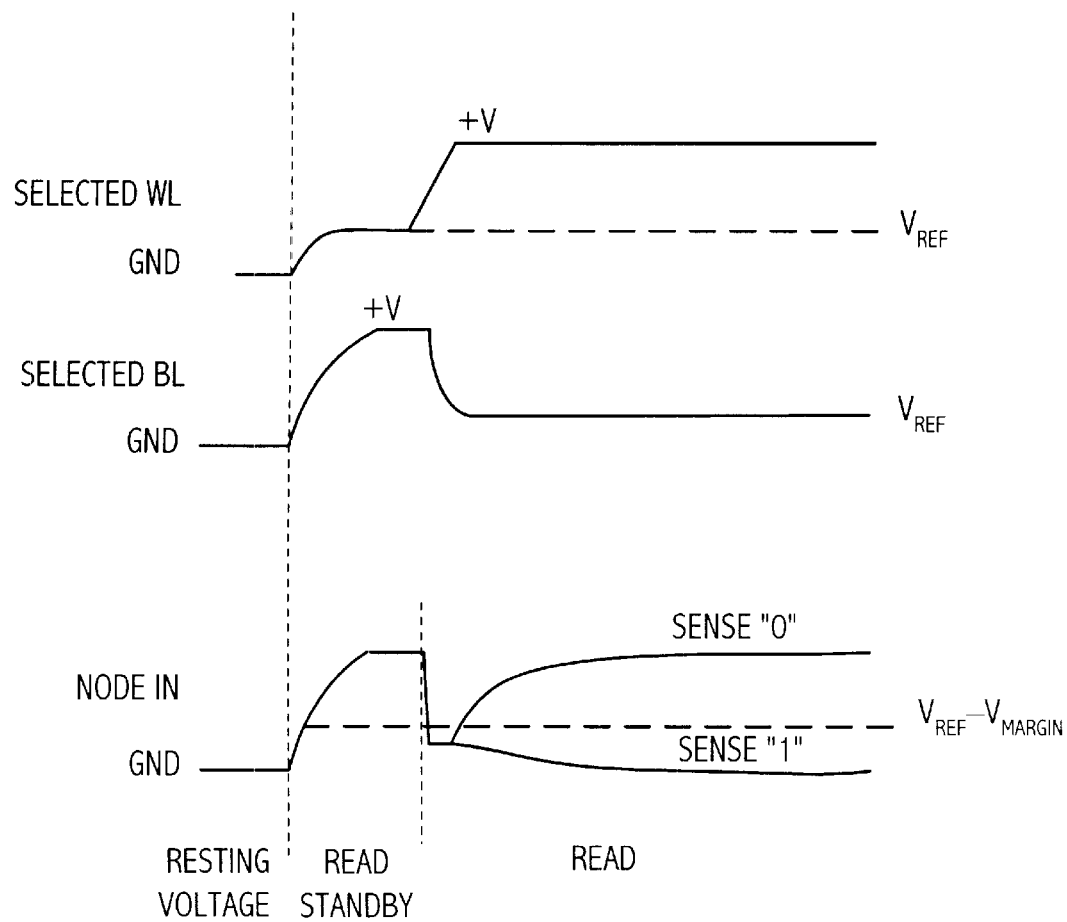
FIG. 3 is a waveform diagram of various signals within the circuit depicted in FIG. 2.

Referring now to FIG. 3, a timing diagram is shown illustrating the operation just described. Initially, the word lines and bit lines are driven to $V_{REF}$ and +V, respectively, to place the array in a read stand-by state. Then, the selected word line 102 is driven from a $V_{REF}$ voltage to a +V voltage by the driver 110. At about the same time (for certain embodiments), the bit line selection switch 111 is turned on to couple the selected bit line 106 to the current sense circuit 120, and the precharge device 132 is also turned on. As a result, node 128 (the IN node) is pulled toward ground to a voltage below the $V_{REF}$ voltage, and the selected bit line 106 is driven from its earlier bias voltage of +V to the $V_{REF}$ voltage. Since the bit line is driven to the $V_{REF}$ voltage through a device that gradually turns off as the bit line approaches its final voltage (i.e., clamp device 126), the bit line transition is shown asymptotically approaching its final voltage of $V_{REF}$. The IN voltage is initially pulled below the $V_{REF}$ voltage by the precharge device 132, and then either rises to the $V_{REF}$ voltage or falls below the $V_{REF}-V_{MARGIN}$ voltage, depending upon the magnitude of the current through the selected memory cell (which, of course, depends upon the data state of the memory cell).

With the exemplary values of +V (i.e., $V_{DD}$) and $V_{REF}$ (about ⅓ $V_{DD}$) thus far described, the selected bit line and selected word line go through a transition greater than 1 volt when selected. Even though it is desirable to reduce or minimize noise produced by any transitioning lines in the array, the noise from these transitioning lines may be allowed to settle out before sensing, and such transitions on both the selected word line and selected bit line produce a beneficial bias condition for reducing leakage currents in the memory array.

Figure 4:
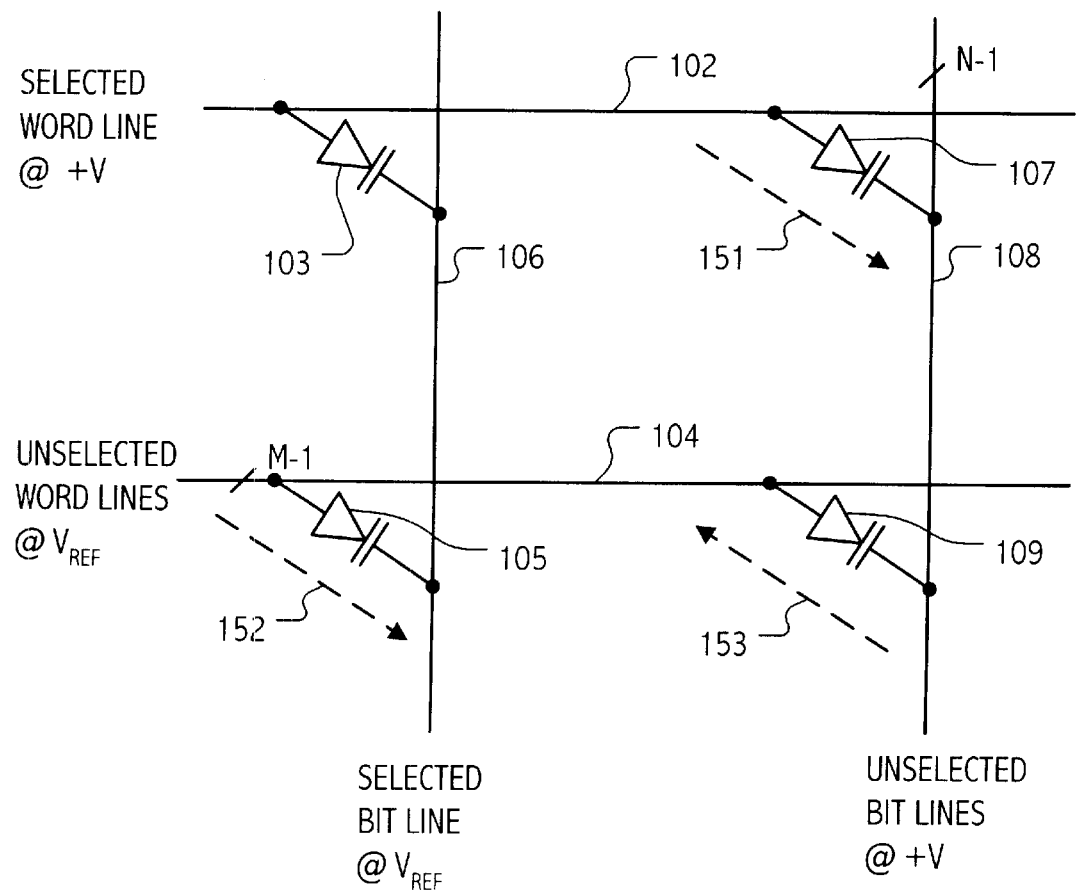
FIG. 4 is an electrical schematic diagram of a diode stack-type memory array, illustrating a preferred bias condition of word lines and bit lines when reading a selected memory cell.

Referring now to FIG. 4, there are shown three leakage paths in the array. Leakage path 151 represents the current through the half-selected memory cells 107 on the selected word line 102, leakage path 152 represents the current through the half-selected memory cells 105 on the selected bit line 106, and leakage path 153 represents the current through the unselected memory cells 109 coupled between the unselected word lines 104 and the unselected bit lines 108. The leakage paths 151 and 152 are very undesirable because they can interfere with the bit line sensing operation, and leakage path 153 is undesirable because it dissipates power. The bias voltages on the selected and unselected word lines and bit lines, including the voltage transients necessary to achieve this bias condition, are preferably chosen to provide substantially zero bias across the diodes that make up leakage paths 151 and 152, and further to reduce the current through leakage path 153.

Any leakage current flowing through path 151 causes a current to flow through the selected word line 102. Since word lines and bit lines, especially in high-density memory arrays, have some amount of series resistance, this current would cause a voltage drop on the selected word line, and the resulting voltage impressed across the selected memory cell would depend on its location in the array. This would lead to a variation in the current provided by a programmed memory cell depending on its location in the array, and a reduction in the signal provided by some memory cells. The preferred bias voltage across the half-selected memory cells 107 is zero because the selected word line 102 and the unselected bit lines 108 are both biased at +V.

Any leakage current flowing through path 152 causes a current to flow through the selected bit line 106. Such a current would add to the current being summed at node 128, and potentially change the voltage of node 128 and seriously affect the sensing operation. The preferred bias voltage across the half-selected memory cells 105 is zero because the selected bit line is clamped to $V_{REF}$ and the unselected word lines are biased at $V_{REF}$. However, a small bias voltage across the half-selected memory cells that is close enough to zero may still result in leakage current that is insignificant (e.g., less than about 5–10%) relative to a selected memory cell current.

The bit line would rise above $V_{REF}$ only if the selected memory cell conducts a sufficient current long enough to cause node IN to reach $V_{REF}$. Any excess current is unimportant, as it causes the selected bit line to rise above $V_{REF}$ and be lost in leakage path 152.

In three-dimensional (i.e., multi-layer) memory arrays, the leakage path 151 may flow to either of two bit line layers. Unselected bit lines in both layers are preferably biased to +V. Similarly, the leakage path 152 may flow to either of two word line layers, and both are preferably biased at $V_{REF}$. Other non-adjacent word line and bit line layers are preferably left floating to save power.

Noise Detection Lines

Figure 5:
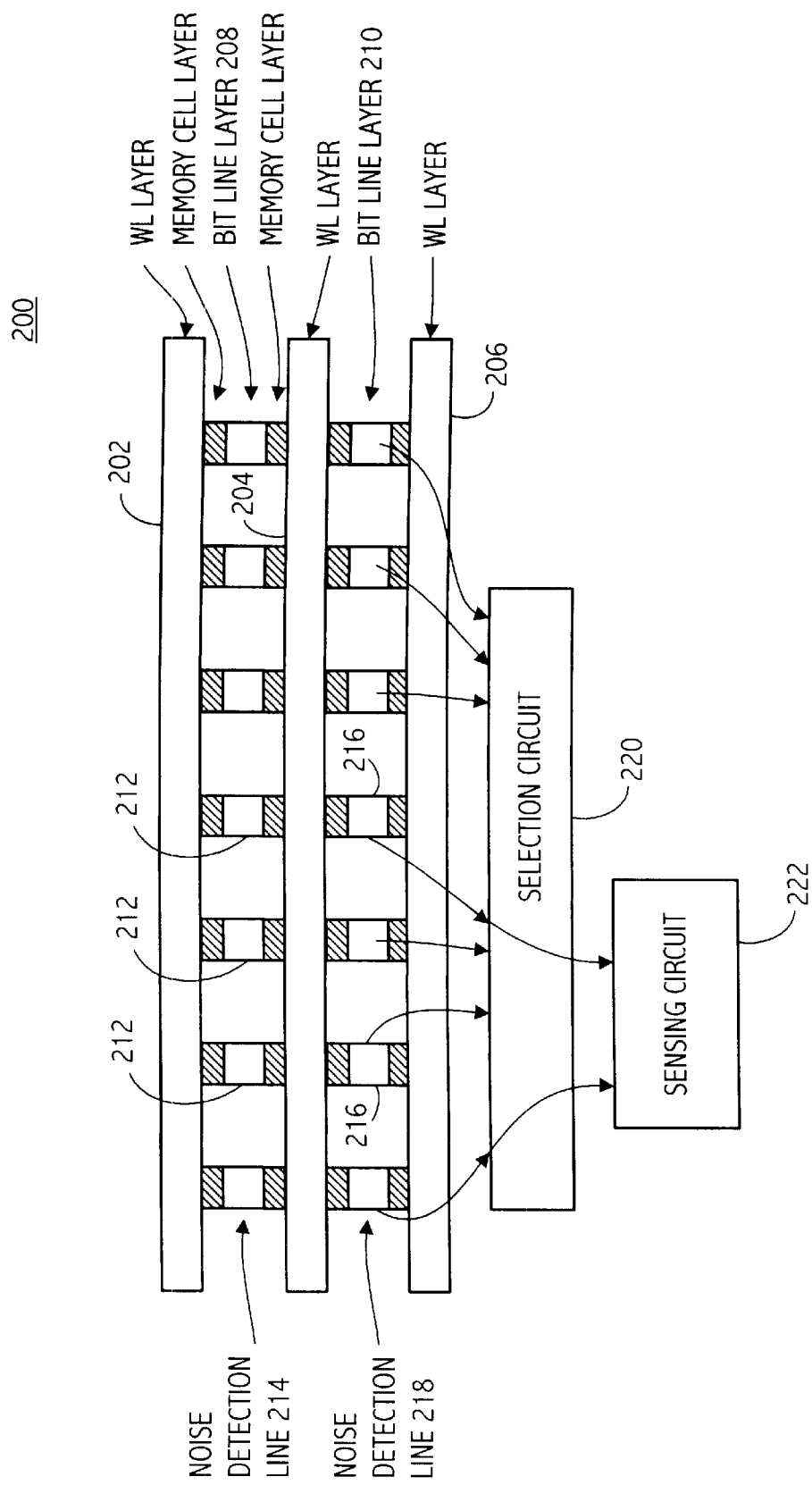
FIG. 5 is a cross-sectional representation of a multi-level memory array indicating a respective noise detection line associated with a respective group of bit lines.

Referring now to FIG. 5, a preferred embodiment of a three-dimensional (i.e., multi-level) memory array 200 has multiple layers of bit lines and multiple layers of word lines generally orthogonal to the bit lines. Three layers of word lines are shown, labeled 202, 204, and 206. Each layer of bit lines includes at least one noise detection line (NDL) associated with a group of some or all of the bit lines on the layer. For example, a bit line layer 208 is disposed between the word line layers 202 and 204, and includes a group of bit lines 212 and a noise detection line 214. A second bit line layer 210 is disposed between the word line layers 204 and 206 and includes a group of bit lines 216 and a noise detection line 218. Each NDL on a layer is constructed to be as identical to the other bit lines on that layer as possible, having the same shape and size as a bit line, running parallel to the bit lines, and crossing over (and under) the same word lines as do the bit lines, so that the various capacitances and noise coupling of a bit line, particularly to the word lines above and below, matches that of the NDL.

In operation, a bit line is decoded and the selected bit line is coupled by a selection circuit 220 to a sensing circuit 222. A noise detection line associated with the selected bit line is also coupled by the selection circuit 220 to the sensing circuit 222 to provide a noise reference to enhance sensing of the selected memory cell on the selected bit line. If a bit line on a particular layer of the memory array is selected and coupled to the sensing circuit, the NDL associated with the selected bit line is also disposed on the same particular layer and is coupled to the sensing circuit.

In a preferred embodiment, a layer of bit lines are associated with memory cells within a memory plane disposed above the bit line layer, and also associated with memory cells within a memory plane disposed below the bit line layer. For example, the bit line layer 208 is associated with memory cells above the bit line layer 208 (i.e., coupled to word lines within the word line layer 202) and also associated with memory cells below the bit line layer 208 (i.e., coupled to word lines within the word line layer 204). Consequently, a NDL on a given bit line layer is associated with sensing memory cells in the adjacent memory planes both above and below the bit line layer (of course, if each such memory plane exists: if a bit line layer forms the top-most or bottom-most layer in the array, only one such adjacent memory plane is associated with the bit line layer).

In a preferred embodiment incorporating antifuse memory elements, the memory cells on the noise detection line are not written (programmed) to the conductive state, so that when sensing, any current flowing into the noise detection line is only displacement current arising from capacitive coupling. The routing path of each noise detection line from the memory array through selection circuitry to the sense amplifier is preferably implemented similarly to the path for its associated bit lines, to again achieve close matching of any capacitance and coupling. A selection circuit 220 and sensing circuit 222 maybe provided for each bit line layer, or may serve bit lines and noise detection lines on more than one bit line layer. Moreover, more than one selection circuit 220 and sensing circuit 222 may be provided for a single bit line layer.

Figure 6:
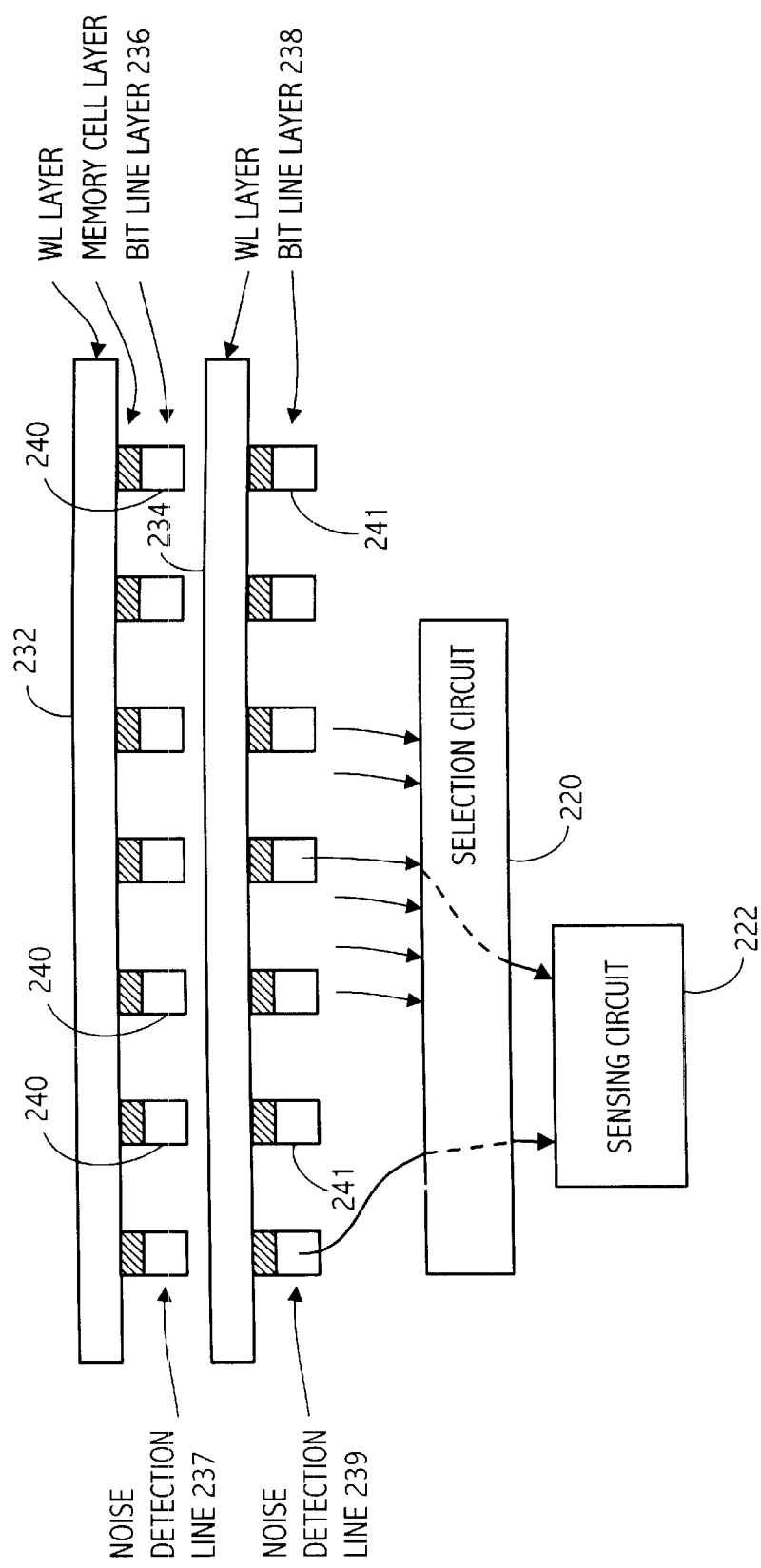
FIG. 6 is a cross-sectional representation of another multi-level memory array indicating a respective noise detection line associated with a respective group of bit lines.

Referring now to FIG. 6, another embodiment is shown of a memory array having a dedicated bit line layer and word line layer for each memory plane. At least one noise detection line is associated with each bit line layer. Two layers of word lines are shown, labeled 232 and 234. A bit line layer 236 is associated with the word line layer 232, and includes a group of bit lines 240 and a noise detection line 237. A bit line layer 238 is associated with the word line layer 234 and includes a group of bit lines 241 and a noise detection line 239. As before, each noise detection line on a layer is constructed to be as identical to the other bit lines on that layer as possible to closely match the various capacitances and noise coupling of a bit line.

Figure 7:
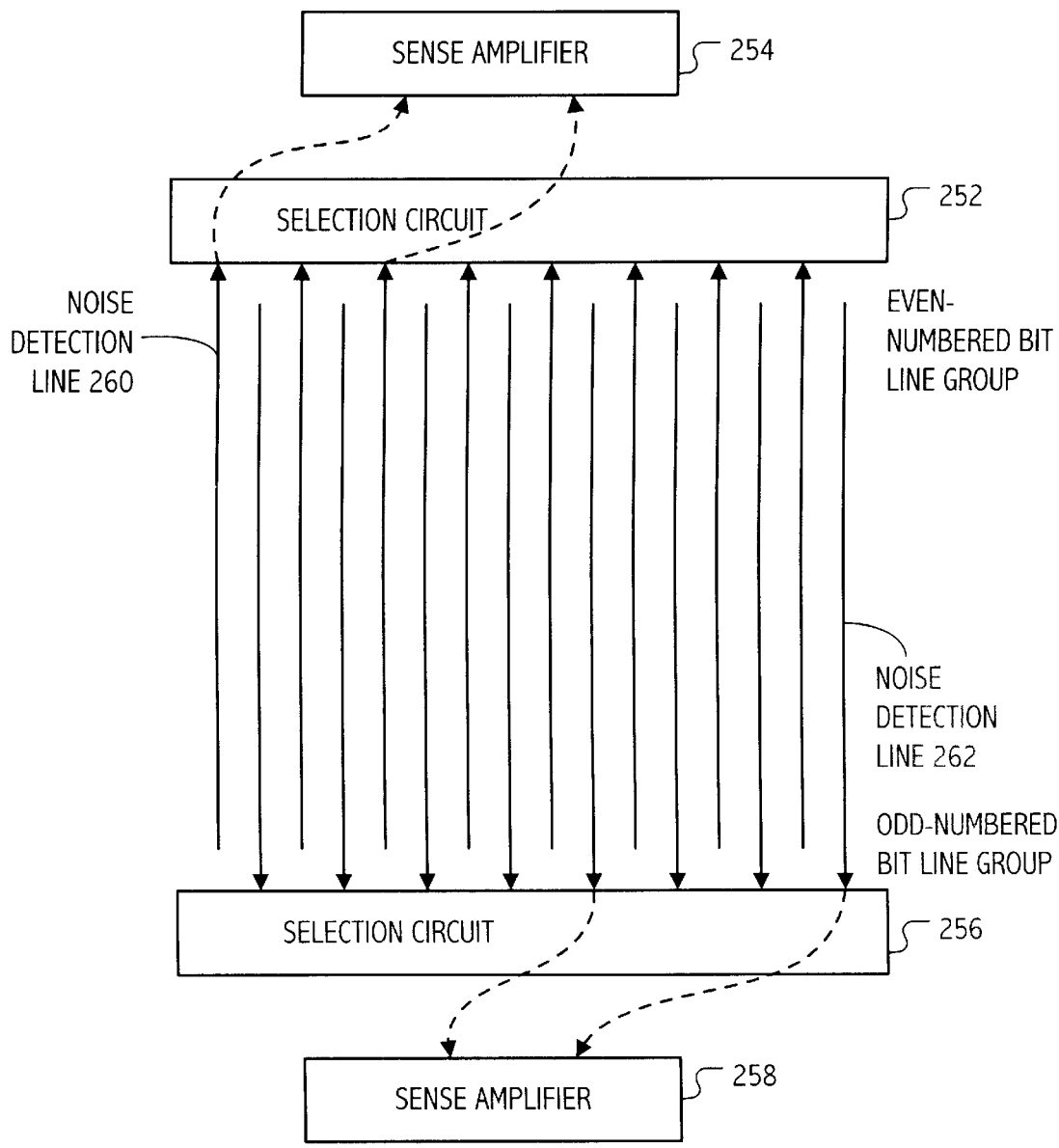
FIG. 7 is a plan view showing a memory array having two groups of bit lines, each associated with a respective noise detection line, selection circuit, and sensing circuit.

Referring now to FIG. 7, a memory array 250 is shown in which bit lines on each layer are divided into two groups. One group of bit lines is routed to one side of the array, and the other group is routed to the opposite side of the array (e.g., top and bottom, as shown here). In this embodiment, the even-numbered bit lines are associated with a selection circuit 252 and a sensing circuit 254 at the top of the array, and the odd-numbered bit lines are associated with a selection circuit 256 and a sensing circuit 258 located at the bottom of the array. A noise detection line 260 is provided for the even-numbered bit lines, and is routed by the selection circuit 252 to the sensing circuit 254 at the top of the array, along with the selected even-numbered bit line. A noise detection line 262 is provided for the odd-numbered bit lines, and is routed by the selection circuit 256 to the sensing circuit 258 at the bottom of the array, along with the selected odd-numbered bit line.

With selection circuitry arranged on each of the two sides of the array, it is easier to implement a selection circuit that provides a connection to each of its associated bit lines. Although it is contemplated within the scope of the invention to have just one noise detection line associated with the bit lines on a layer, and connect the single noise detection line to a sensing circuit at both the top and bottom of the array (either simultaneously or not), it is preferable to have at least two noise detection lines associated with each layer of bit lines because each noise detection line may then be implemented in a manner that more carefully matches its associated bit lines. For example, the noise detection line 260 associated with the even-numbered group is coupled to the sensing circuit at the top of the array and is constructed to have similar length and capacitance as the even-numbered bit lines, including the routing and selection circuitry. If the noise detection line 260 was coupled to both top and bottom sensing circuits, it would likely not match either the even-numbered or the odd-numbered bit lines as well.

There is preferably at least one sensing circuit (e.g., 254) for each side of the array having bit lines (or other array lines) exiting the array. In certain embodiments, particularly large arrays, more than one sensing circuit for a side of the array is preferred to reduce the otherwise required length and capacitance of routing wires. A single noise detection line may be associated with multiple sensing circuits and is coupled by a selection switch, such as within a selection circuit 252, to whichever of the sensing circuits is decoded and selected. It is preferable that a bit line is never selected for sensing when adjacent to another bit line which is also selected for sensing, or which is adjacent to a noise detection line which is active, to avoid the noise of adjacent bit line swings during sensing. The bit lines and noise detection lines from one group, such as the even-numbered bit lines, are preferably interdigitated with the bit lines and noise detection line from the other group. When multiple bit lines in a group are connected to multiple sense amplifiers, the interdigitating allows more flexibility in the selection choice in a selector circuit on each side of the array, including choosing the closest bit lines in a given group because they are not adjacent in the array. If the first even-numbered bit line (e.g., a BL0) is selected, the adjacent bit line is an odd-numbered bit line and is not selected. Although it is desirable to select one bit line for every available sense amplifier for high data bandwidth, an odd-numbered bit line (e.g., a BL511), which is spaced many bit lines away from the selected even-numbered bit line BL0, is selected.

Figure 8:
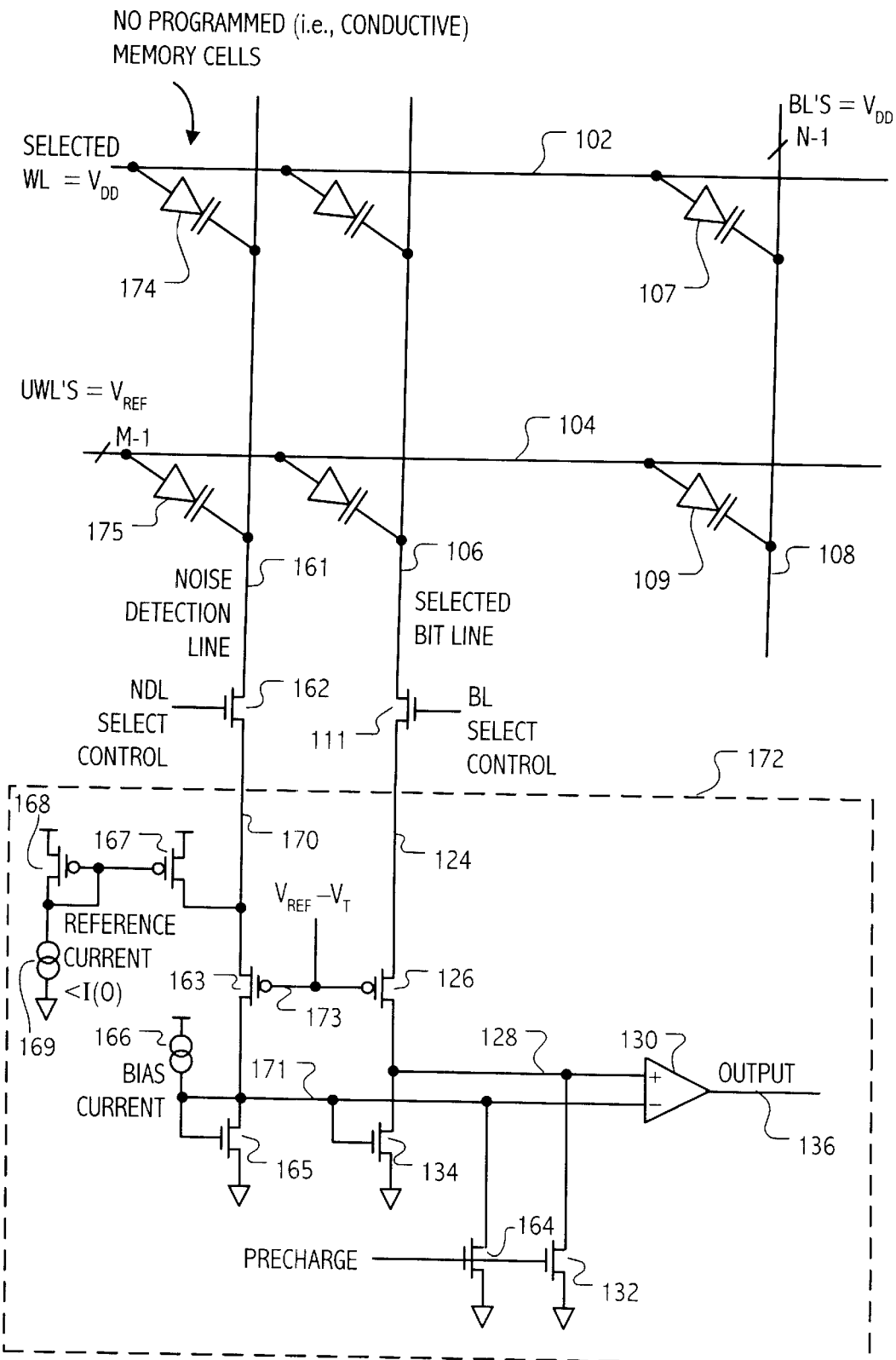
FIG. 8 is an electrical schematic diagram illustrating a bit line sensing circuit, in accordance with an embodiment of the present invention, which utilizes a noise detection line in the memory array.

Referring now to FIG. 8, a clamped bit line sensing circuit 172 utilizes a noise detection line to provide a reference for sensing and to achieve a greater tolerance for array noise. The selected bit line 106 is connected through the selection switch 111 to the drain of the PMOS clamp device 126, whose gate terminal is connected to the $V_{REF2}$ voltage which is equal to about a PMOS threshold below the unselected word line voltage $V_{REF}$, and whose source is connected to a non-inverting input (node 128) of a voltage sensing circuit 130, as before. A noise detection line 161 is parallel to, but not adjacent to, the selected bit line 106. All the word lines which traverse over the regular bit lines also traverse over the noise detection line 161, but no memory cells coupled between any of the word lines and the noise detection line 161 are programmed to source any current into the noise detection line 161. The noise detection line 161 is coupled through a selection device 162 to the drain of a matching PMOS clamp device 163, whose gate is also connected to the $V_{REF2}$ voltage (i.e., $V_{REF}-V_{T,P}$), and whose source terminal (node 171) is connected to an inverting input of the voltage sensing circuit 130 (i.e., the "reference" side of the voltage sensing circuit 130).

A reference current 169 is provided having a magnitude that is less than the current through a memory cell when programmed in a zero state. This reference current 169 is mirrored by transistors 168 and 167 to flow into node 170, which is analogous to the input node 124 of the sense circuit 172. Since the noise detection line 161 has no other memory cells programmed to conduct current into the noise detection line 161, the current sense circuit 172 may be visualized as having an input node 124 into which flows any current through a selected memory cell, and further having a reference input node 170 into which flows a reference current. Such a reference current preferably has a magnitude equal to the mid-point between a programmed cell current and an unprogrammed cell current, although other choices may be desirable. For the not unusual case where the unprogrammed cell current is negligible, the reference current may be preferably equal to about ½ the expected current through a programmed cell. Such a reference current may be advantageously generated using trimmable resistors and various current mirror ratios to achieve the desired current at the desired node (e.g., the sense or summing node 128). In a semiconductor process providing antifuse memory cells, such trimmable resistors may be easily achieved using one or more memory cells.

The precharge devices 132 and 164 are provided to bias both the selected bit line 106 and the noise detection line 161 at a $V_{REF}$ voltage. After the precharge devices 132 and 164 are turned off, the reference current 169 is preferably enabled. The reference current flowing into node 170 flows through a biasing transistor 165 and is mirrored by transistor 134 to subtract a current equal to the reference current 169 from the input node 128 of the amplifier 130. The current through the selected memory cell (if any) and the reference current are thus summed at node 128. If the selected cell current is greater than the reference current, node 128 rises above the voltage of reference node 171. Alternatively, if the selected cell current is less than the reference current, node 128 falls below the voltage of reference node 171. Node 128 thus rises above or falls below the voltage of node 171 depending on the memory cell state, and does so without any substantial voltage change on the selected bit line 106. After a chosen time for the differential signal to develop between nodes 128 and 171, the amplifier 130 may be enabled to compare the voltage of node 128 to the voltage of node 171 and produce an output signal on an output node 136.

Figure 9:
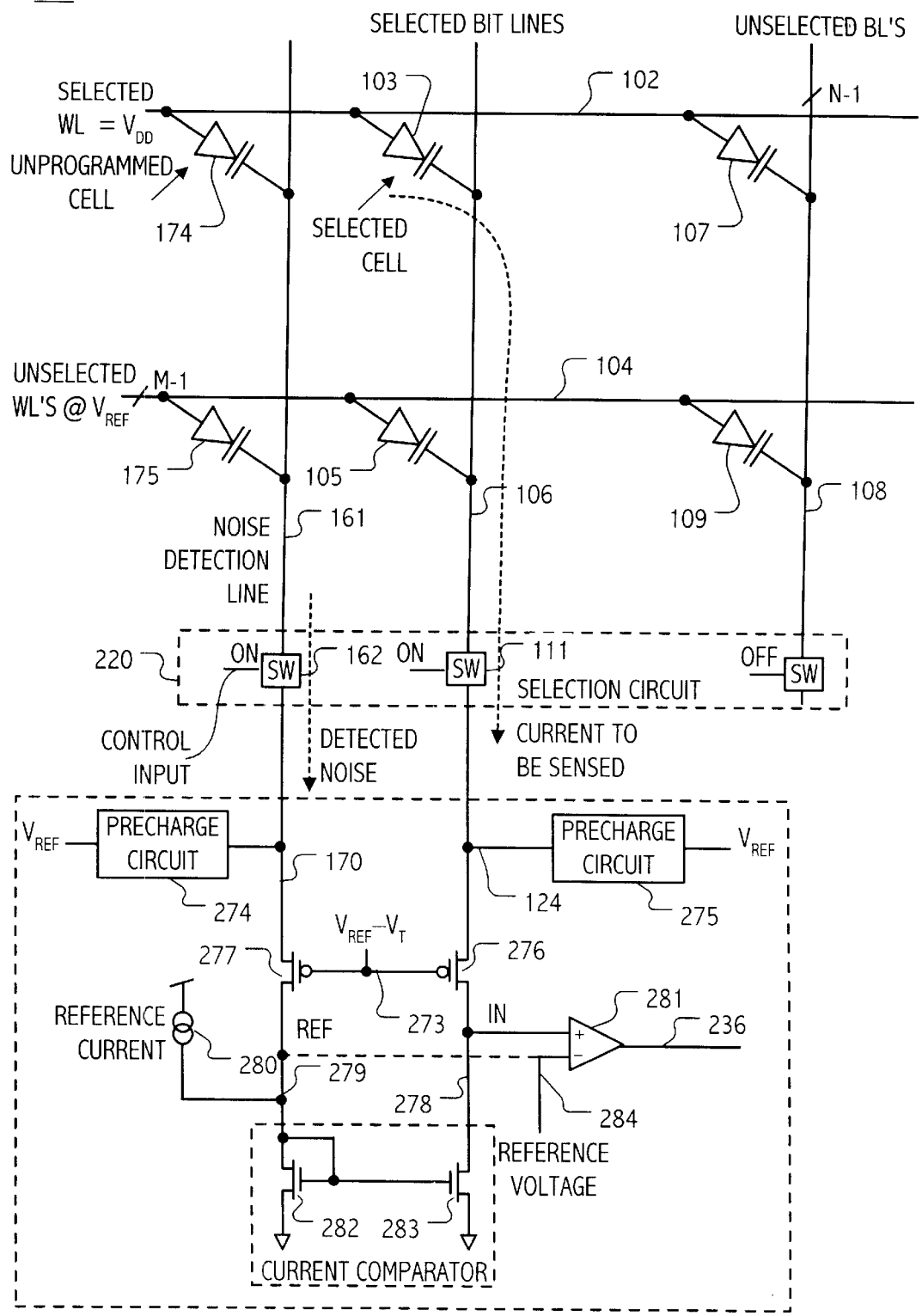
FIG. 9 is an electrical schematic diagram illustrating a clamped bit line sensing circuit, in accordance with another embodiment of the present invention, utilizing a noise detection line in the memory array.

Referring now to FIG. 9, another clamped bit line sensing circuit 272 is shown which achieves improved current sensing of antifuse memory arrays by using the noise detection line to provide a reference for sensing. The selected bit line 106 and the associated noise detection line 161 are both biased to the $V_{REF}$ voltage by respective precharge circuits 275 and 274. The precharge circuits 274, 275 are then turned off and a reference current 280 is enabled which sources a reference current through device 282, which is mirrored by transistor 283 to the IN node (also labeled 278) of an amplifier 281. A pair of PMOS cascode transistors 276 and 277 are provided to pass current from the selected bit line 106 and noise detection line 161 to the amplifier input, while the selected bit line 106 remains substantially at a fixed voltage, and to allow the amplifier nodes IN and REF to have substantial voltage changes. The current mirroring transistors 282 and 283 function as a pair of current comparing devices, that compares the reference current 280 plus noise current on the noise detection line (and which results in a particular voltage on the REF node 279) to the selected memory cell current plus noise current on the selected bit line (which results in a corresponding voltage on the IN node 278). The IN node voltage is compared to a reference voltage conveyed on node 284 by the amplifier 281 to generate an output signal on node 236. The reference voltage on node 284 is preferably larger than the IN node voltage expected for a cell with one state but less than the voltage expected for zero state. The reference current 280 is preferably large enough to bias the current comparison devices 282 and 283 well above their threshold voltage, to provide reasonable tolerance to threshold mismatches and ground voltage variations in the integrated circuit. For certain voltage and current choices, node 279 may be used as the reference voltage 284.

Figure 10:
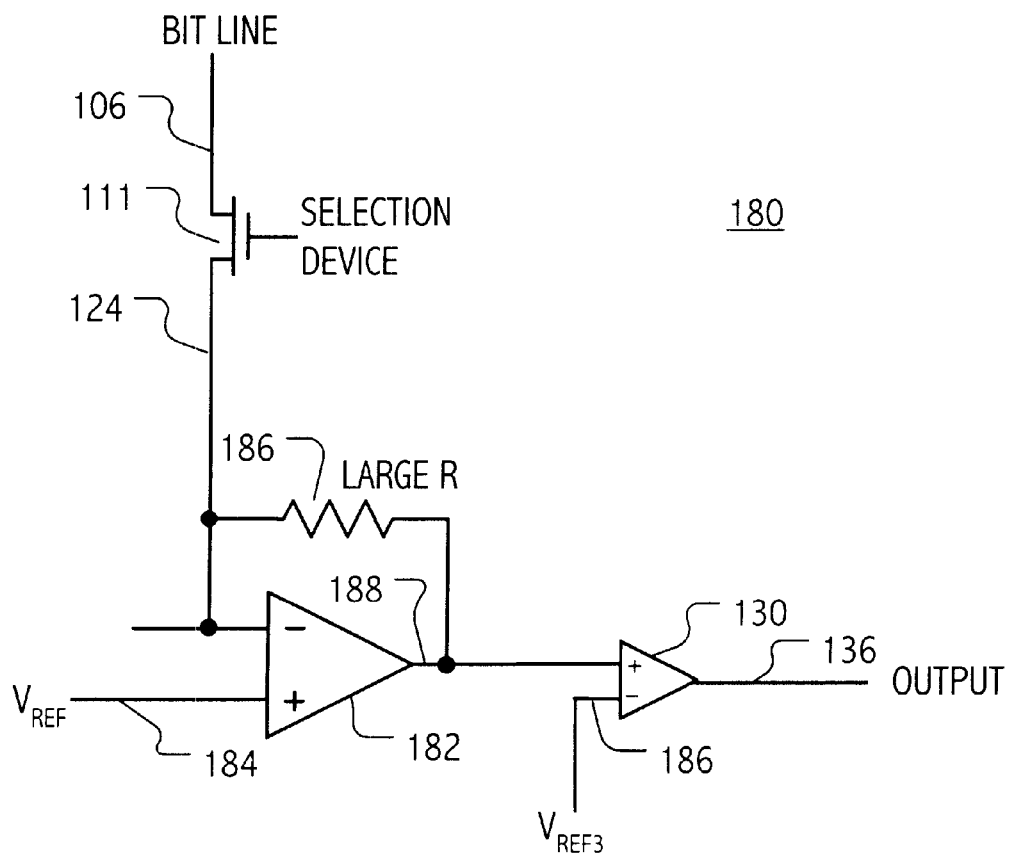
FIG. 10 is an electrical schematic diagram illustrating a clamped bit line sensing circuit, in accordance with another embodiment of the present invention.

Referring now to FIG. 10, another embodiment of a clamped bit line sense amplifier 180 includes an amplifier 182 incorporating feedback through a resistor 186 to control the clamping of the selected bit line 106 at the $V_{REF}$ voltage. If the voltage of node 124 (and the selected bit line) is below the $V_{REF}$ voltage, the amplifier 182 drives its output node 188 higher to cause less current to flow through resistor 186 into node 124, thus raising its voltage. Conversely, if the voltage of node 124 is above the $V_{REF}$ voltage, the amplifier 182 drives its output node 188 lower to cause more current to flow from node 124, through resistor 186, thus lowering the voltage of node 124 and the selected bit line 106. The output of the amplifier 182 is compared to a reference voltage $V_{REF3}$ (conveyed on node 186) by the second amplifier 130 to produce an output signal on node 136.

The selected bit line 106 reaches the desired level $V_{REF}$ more quickly due to the drive capability of the amplified feedback. With the choice of the feedback resistor 186 large enough, the feedback circuit also amplifies the bit line signal so the second amplifier 130 is less critical, as is the choice of the $V_{REF3}$ voltage. For example, the $V_{REF3}$ voltage may be substantially equal to the $V_{REF}$ voltage, or to some other suitable voltage. With sufficient amplification from the clamp circuit, no special reference is needed, and a single-sided amplifier may be employed.

Figure 11:
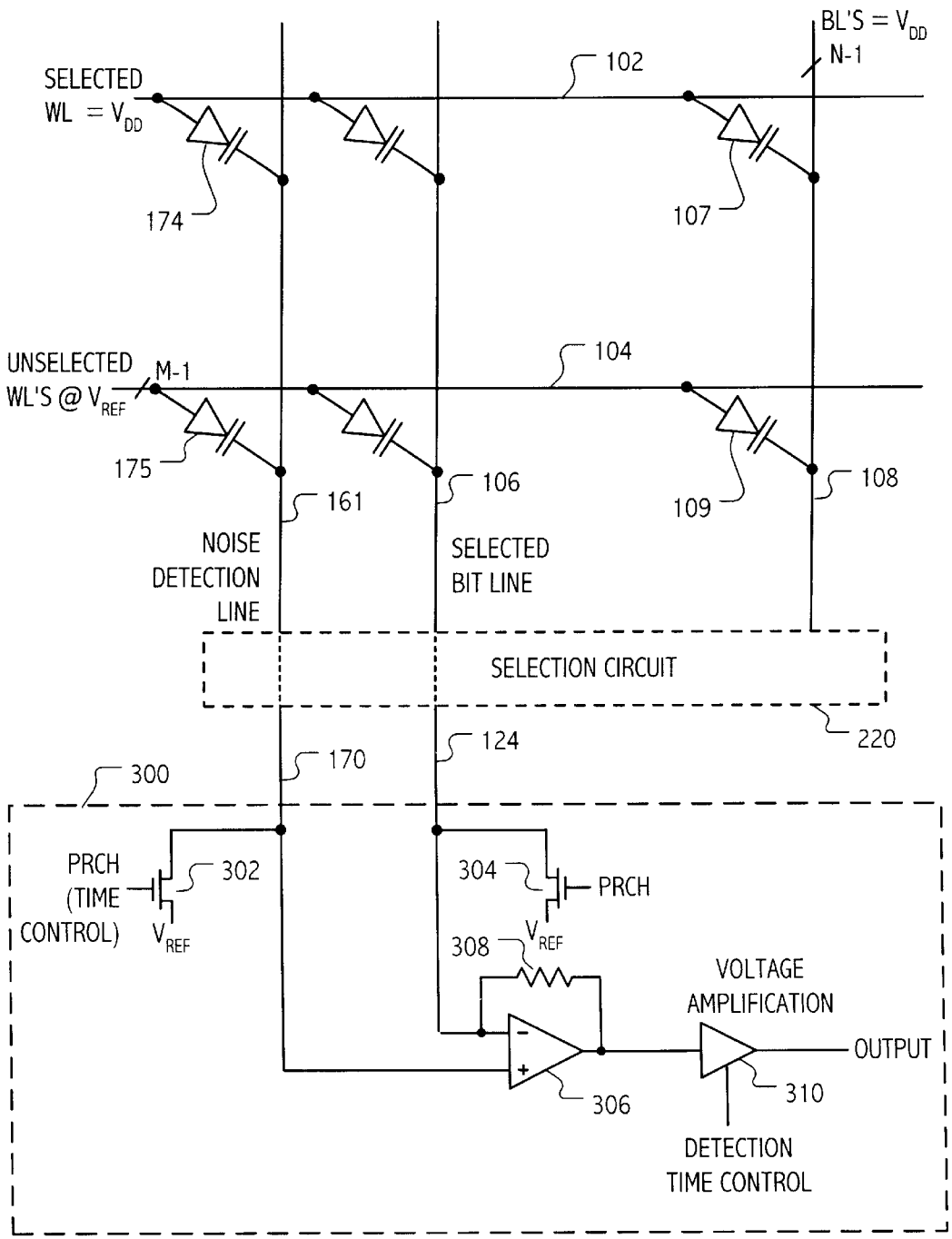
FIG. 11 is an electrical schematic diagram illustrating a clamped bit line sensing circuit, in accordance with another embodiment of the present invention, utilizing a noise detection line in the memory array to provide a reference level for an active feedback clamping circuit.

Referring now to FIG. 11, a clamped bit line sense amplifier 300 is shown which uses an amplified feedback network to maintain the selected bit line voltage. By using a noise detection line in the configuration shown, no reference current is needed to distinguish between the one and zero state of the memory cell. Such a reference current is frequently difficult to provide because the current through a programmed memory cell varies greatly with normal manufacturing tolerances. In the embodiment shown, the selected bit line 106 and noise detection line 161 are driven to the unselected word line voltage $V_{REF}$ during a precharge time and then released. A time delay is provide after turning off the precharge transistors 302 and 304 before enabling the amplifier 310, to provide sufficient time for voltage amplification of amplifier 306 to produce a valid output signal on the OUT node. The effect of coupled noise on the selected bit line is balanced by the effect of coupled noise on the noise detection line. Both lines will move by the same voltage since the capacitance of both lines is matched. The amplifier 306 produces a current through the feedback resistor 308 which is substantially equal to the selected cell signal current and is substantially insensitive to the noise coupled to the selected bit line. This current through resistor 308 produces a large voltage change on the OUT node (assuming a suitably large valued resistor) which can be sensed by a voltage sensing circuit 310 activated at a detection time (i.e., after the time delay). This voltage change on the OUT node can be more rapid and much larger than the current to be sensed could have produced on the bit line. The voltage excursions of node OUT may be large enough to satisfactorily use a single-ended amplifer for the voltage sensing circuit 310.

Figure 12:
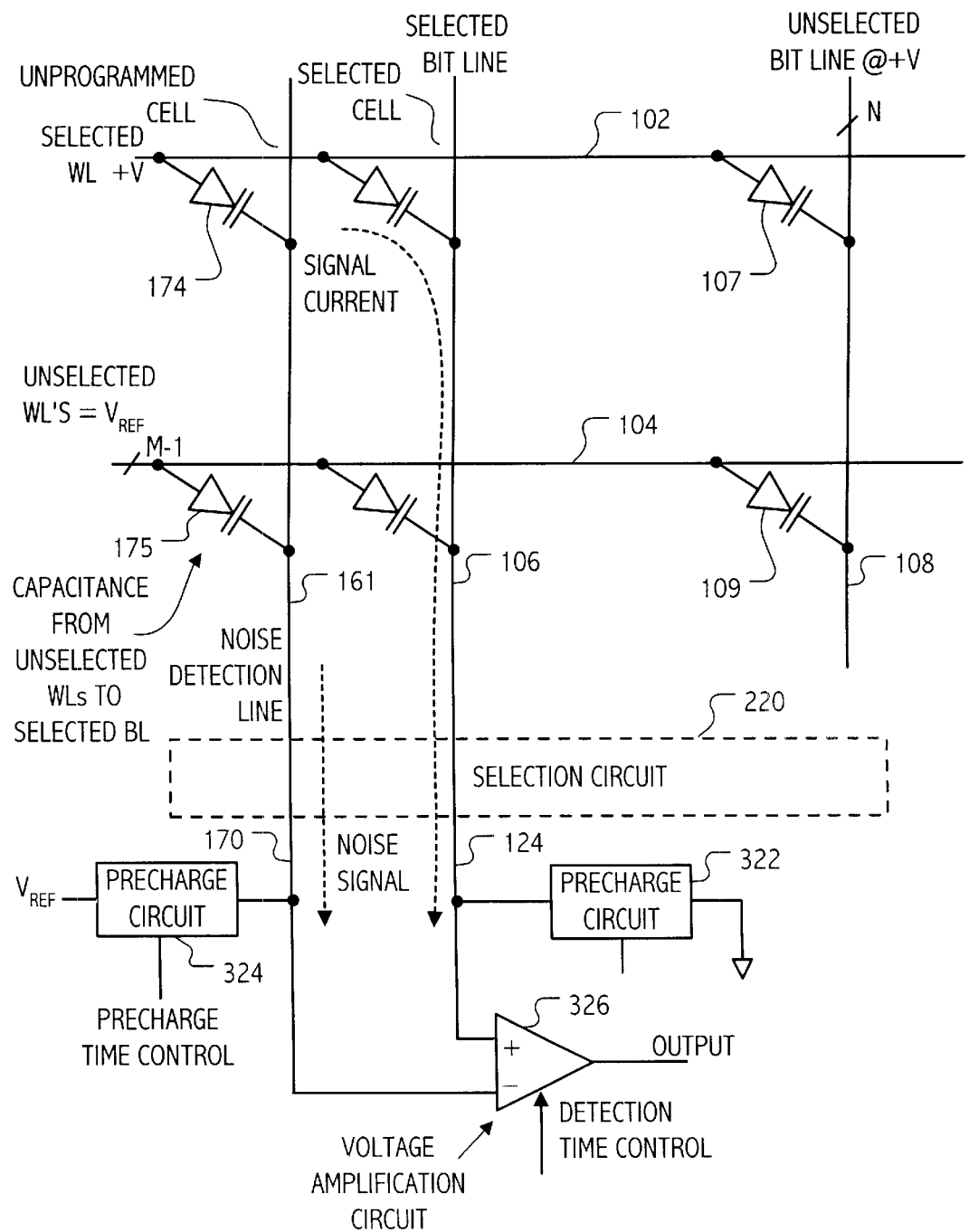
FIG. 12 is an electrical schematic diagram illustrating a bit line voltage variation sensing circuit, in accordance with another embodiment of the present invention, utilizing a noise detection line in the memory array.
Figure 13:
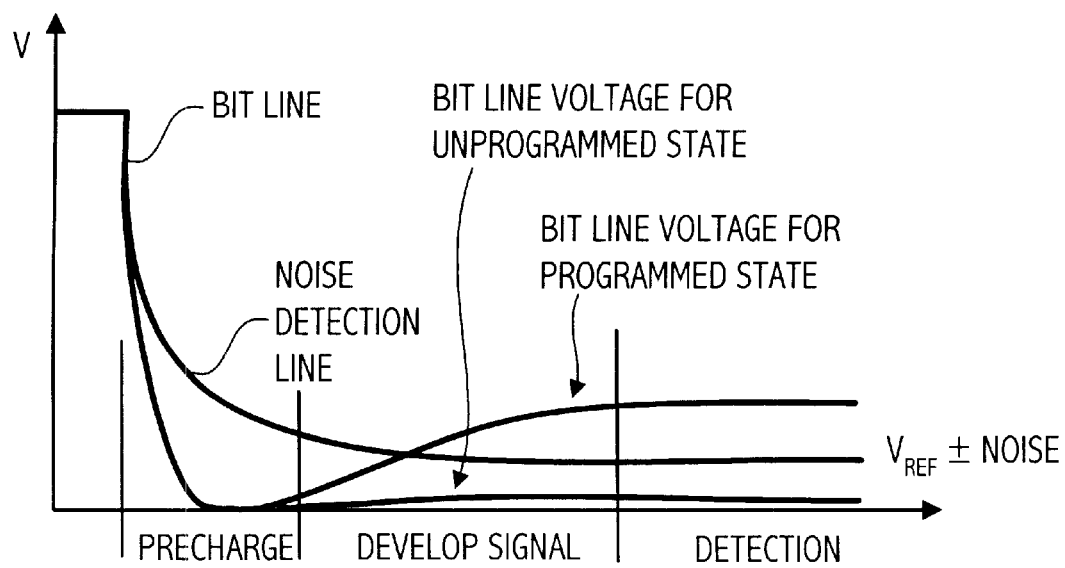
FIG. 13 is a waveform diagram of various signals and node voltages of the circuit shown in FIG. 12.

While noise detection lines are extremely beneficial when using a clamped bit line sensing circuit, they are even more beneficial when using a voltage sensing circuit. Referring now to FIG. 12, a memory array is shown which advantageously utilizes a noise detection line with a voltage detection circuit 320. The selected bit line is pulled to ground by precharge circuit 322 and the noise detection line is pulled to $V_{REF}$ by precharge circuit 324 before sensing. Such precharge circuits may be as simple as an NMOS device turned on during precharge time. If the selected memory cell was programmed to a conductive state, the selected memory cell signal current pulls up the selected bit line above $V_{REF}$ in a predetermined amount of time. If the selected memory cell was unprogrammed and remains in the nonconductive state, the selected memory cell signal current is negligible and the selected bit line remains below $V_{REF}$. The noise detection line is floating at $V_{REF}$ and moves according to coupled noise or leakage through unselected cells on the selected bit line. Such leakage, as described above, can be reduced by biasing the unselected word lines at the $V_{REF}$ voltage. At detection time, a voltage comparison and amplification circuit 326 is activated and produces an output based upon the difference between the noise detection line voltage and the selected bit line voltage. (See FIG. 13 for a waveform diagram of these signals.) Since the noise on the noise detection line is similar to the noise on the selected bit line, this voltage difference is less affected by noise than in an alternate circuit which compares the voltage on the selected bit line to a fixed reference voltage such as $V_{REF}$.

Figure 14:
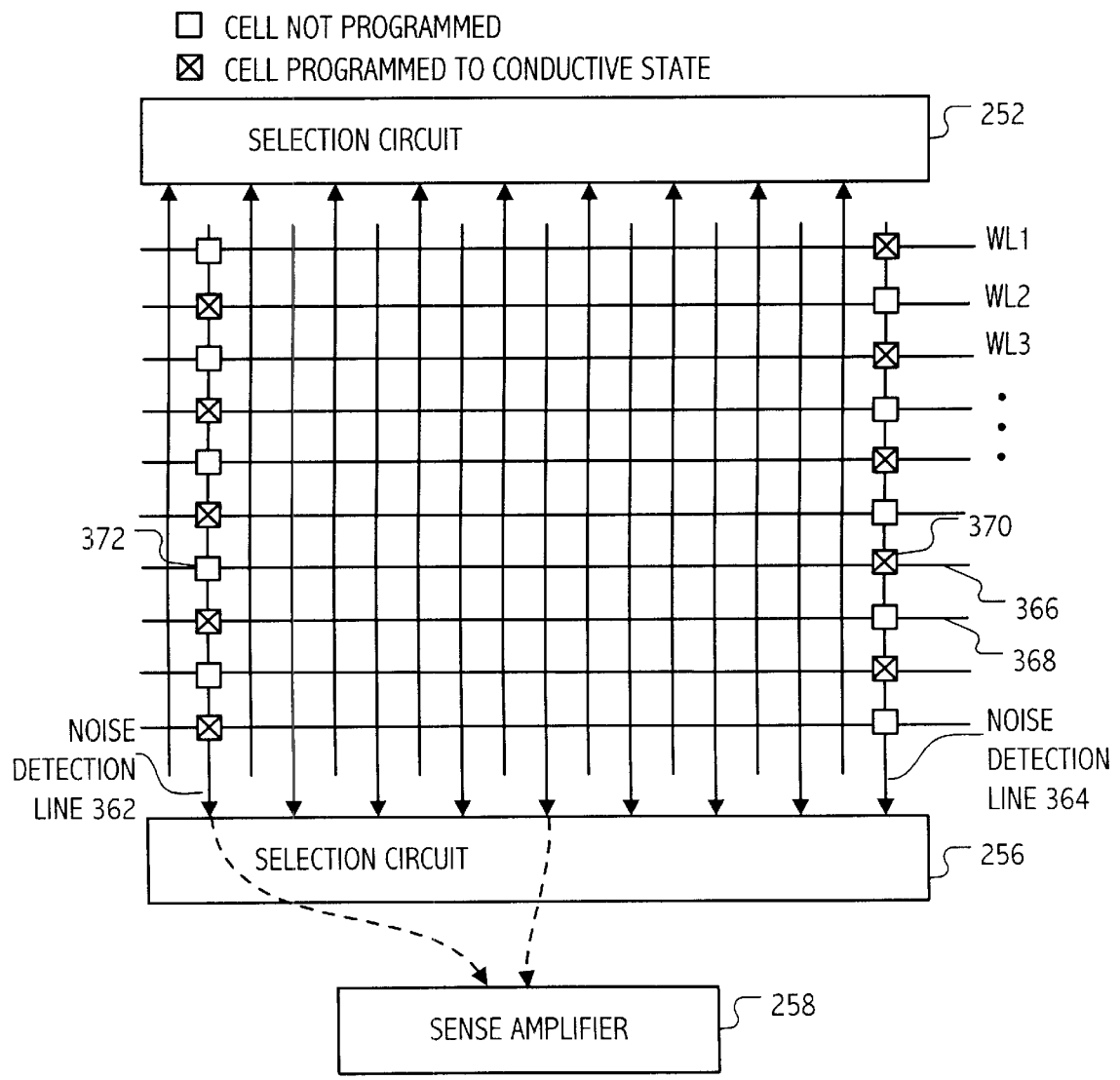
FIG. 14 is a plan view of a memory array having a pair of noise detection lines for each group of bit lines, in accordance with an embodiment of the present invention.

Referring now to FIG. 14, an embodiment of a memory array is shown which utilizes a pair of noise detection lines for the even-numbered bit lines, and another pair of noise detection lines for the odd-numbered bit lines. In a broader context, a pair of noise detection lines is provided for each associated group of bit lines.

In the memory array 360, a group of even-numbered bit lines is shown associated with the selection circuit 256 at the bottom of the array 360. A first noise detection line 362 is provided, shown here generally on the left side of the array (although not so required), and a second noise detection line 364 is provided, shown here generally on the right side of the array. Half the memory cells on each noise detection line are programmed to a conducting state, but for a given word line, only the memory cell for one of the noise detection lines is programmed. For example, for the left side noise detection line 362, the memory cells associated with the even-numbered word lines are preferably programmed, and for the right side noise detection line 364, the memory cells associated with the odd-numbered word lines are preferably programmed. When a word line is selected in the array, the particular noise detection line whose memory cell associated with that word line is not programmed is coupled to the sense amplifier 258. For example, if word line 366 is selected, the memory cell 370 between word line 366 and the noise detection line 364 is programmed to the conducting state, and the other noise detection line 372 is selected by the selection circuit 256 and coupled to the sense amplifier 258 (as shown in the figure). If, however, the word line 368 is selected, the noise detection line 364 is selected instead.

These noise detection lines may also be used for testing the write once operation, saving the area that would have been used by an extra column of cells programmed at manufacturing time to confirm word line continuity. Such a technique is described in co-pending U.S. patent application Ser. No. 09/775,956, filed Feb. 2, 2001, entitled "Memory Array Organization and Related Test Method Particularly Well Suited for Integrated Circuits Having Write-Once Memory Arrays," naming inventor James M. Cleeves, which application is incorporated herein by reference in its entirety.

Other Features and Embodiments

While several different sensing circuits have been described herein, the use of noise detection lines is contemplated with other sensing circuits as well. Moreover, the invention is also advantageously employed in a memory array having a single memory plane, and does not require a three-dimensional or multi-level memory array. In certain embodiments, more than two noise detection lines may be employed on each bit line layer for better tracking, allowing a noise detection line which is close to the selected bit line to be selected by the selection circuit. A noise detection line may be connected to more than one sense amplifier to save space, or may be provided for each sense amplifier per bit line group. If a noise detection line is shared among more than one sense circuit, its total capacitance is preferably matched to the total capacitance for the path from a bit line to just one sense amplifier. In another embodiment, a noise detection line is associated with just one bit line on just one level. In a preferred embodiment, a three-dimensional array may be implemented with a "word line first" arrangement (a layer of word lines on the bottom closest to circuitry within the substrate) rather than a "bit line first" arrangement to help reduce coupling onto the bottom-most layer of bit lines.

In other embodiments of clamped bit line sensing circuits contemplated herein, the selected bit line may be pulled to $V_{REF}$ before the selected word line is driven to +V. In certain embodiments, the selected bit line may be pulled to $V_{REF}$ by a feedback circuit (such as, for example, a circuit similar to that shown in FIG. 10) connected in parallel with the clamp device, or connected in some other manner, to speed up the transition of the selected bit line to the $V_{REF}$ voltage. Other embodiments may be implemented using complementary polarity devices and complementary voltages to achieve an analogous circuit where a selected word line is pulled down and the selected bit line is pulled up. While the above examples describe selecting one bit line, other embodiments may be implemented which simultaneously select more than one bit line by providing a current sense circuit for each selected bit line.

The instant invention can be applied to any memory array, whether three-dimensional or otherwise, having memory cells exhibiting diode-like characteristic conduction. Preferably, the memory cells are comprised of semiconductor materials, as described in U.S. Pat. No. 6,034,882 to Johnson et al., U.S. Pat. No. 6,185,122 to Johnson, et al., U.S. Pat. No. 5,835,396 to Zhang, U.S. patent application Ser. No. 09/560,626 to Knall, and U.S. patent application Ser. No. 09/638,428 to Johnson, each of which are hereby incorporated by reference. Specifically an antifuse memory cell is preferred. Other passive element memory cells incorporate layers of organic materials including at least one layer that has a diode-like characteristic conduction and at least one organic material that changes conductivity with the application of an electric field. U.S. Pat. No. 6,055,180 to Gudensen et al. describes organic passive element arrays and is also hereby incorporated by reference. Memory cells comprising materials such as phase-change materials and amorphous solids can also be used. See U.S. Pat. No. 5,751,012 to Wolstenholme et al. and U.S. Pat. No. 4,646,266 to Ovshinsky et al., both of which are hereby incorporated by reference.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Although certain supporting circuits (e.g., decoders, drivers, switches, multiplexers, input/output buffers, etc.) are not specifically described, such circuits are well known, and no particular advantage is afforded by specific variations of such circuits in the context of practicing this invention. Moreover, it is believed that one of ordinary skill in the art, equipped with the teaching of this disclosure, will be able to carry out the invention, including implementing various control circuits inferred but not specifically described herein, using well known circuit techniques and without undue experimentation.

As used herein, a passive element memory array includes a plurality of 2-terminal memory cells, each connected between an associated X-line and an associated Y-line. Such a memory array may be planar or may be a three-dimensional array having more than one plane of memory cells. Each such memory cell has a non-linear conductivity in which the current in a reverse direction (i.e., from cathode to anode) is lower than the current in a forward direction. Application of a voltage from anode to cathode greater than a programming level changes the conductivity of the memory cell. The conductivity may decrease when the memory cell incorporates a fuse technology, or may increase when the memory cell incorporates an antifuse technology. A passive element memory array is not necessarily a one-time programmable (i.e., write once) memory array.

Word lines may also be referred to as row lines or X-lines, and bit lines may also be referred to as column lines or Y-lines. The distinction between "word" lines and "bit" lines may carry at least two different connotations to those skilled in the art. When reading a memory array, it is assumed by some practitioners that word lines are "driven" and bit lines are "sensed." In this regard, X-lines (or word lines) are frequently connected to the anode terminal of the memory cells, and Y-lines (or bit lines) are frequently connected to the cathode terminal of the memory cells. Secondly, the memory organization (e.g., data bus width, number of bits simultaneously read during an operation, etc.) may have some association with viewing one set of the two array lines more aligned with data "bits" rather than data "words."

The embodiments described may show a selected word line being driven to a voltage and a selected bit line being sensed, and memory cell anode terminals connected to word lines and cathode terminals connected to bit lines, but other embodiments are specifically contemplated. For example, in a multi-level memory array, an adjacent memory plane may be connected similarly (e.g., a back-to-back diode stack memory array), or may reverse the directionality of memory cells in the adjacent plane (e.g., a serial chain diode stack memory array) so that the anode terminals are connected to bit lines and the cathode terminals to word lines. Consequently, the designations herein of X-lines, word lines, and row lines, and of Y-lines, bit lines, and column lines are illustrative of the various embodiments but should not be viewed in a restrictive sense, but rather a more general sense. For example, the sensing circuits described herein may be coupled to word lines rather than bit lines, or may be used for both word lines and bit lines, when sensing a current in a word line rather than in a bit line. Such organizations (and others) are described in "Three-Dimensional Memory Array Incorporating Serial Chain Diode Stack" by Kleveland, et al, U.S. patent application Ser. No. 09/897,705, which is being filed on the same day as the present application, and which application is hereby incorporated by reference.

The directionality of X-lines (shown horizontally in the various figures) and Y-lines (shown vertically) is merely convenient for ease of description of the two groups of crossing lines in the array. While X-lines are usually orthogonal to Y-lines, such is not necessarily implied by such terminology.

Integrated circuits incorporating a memory array usually subdivide the array into a sometimes large number of smaller arrays, also sometimes known as sub-arrays. As used herein, an array is a contiguous group of memory cells having contiguous word and bit lines generally unbroken by decoders, drivers, sense amplifiers, and input/output circuits. An integrated circuit including a memory array may have one array, more than one array, or even a large number of arrays. The present invention is applicable to integrated circuits having any number of memory arrays.

The block diagrams herein may be described using the terminology of a single node connecting the blocks. Nonetheless, it should be appreciated that, when required by the context, such a "node" may actually represent a pair of nodes for conveying a differential signal, or may represent multiple separate wires (e.g., a bus) for carrying several related signals or for carrying a plurality of signals forming a digital word.

The foregoing details description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, that are intended to define the scope of this invention.

On Mar. 21, 2001, the following U.S. patent applications were filed, each of which is hereby incorporated by reference: "Memory Device with Row and Column Decoder Circuits Arranged in a Checkerboard Pattern under a Plurality of Memory Arrays," U.S. Provisional Application No. 60/277,794; "Passive Element Memory Array and Related Circuits Useful Therefor," U.S. Provisional Application No. 60/277,815; "Three-Dimensional Memory Array," U.S. Provisional Application No. 60/277,738; and "Three-Dimensional Memory Array and Method of Fabrication," U.S. application Ser. No. 09/814,727.

On Jun. 29, 2001, the following U.S. patent applications were filed, each of which is hereby incorporated by reference: "Method and Apparatus for Writing Memory Arrays Using External Source of High Programming Voltage," U.S. patent application Ser. No. 09/897,785; "Three-Dimensional Memory Array Incorporating Serial Chain Diode Stack," U.S. patent application Ser. No. 09/897,705; "Method and Apparatus for Biasing Selected and Unselected Array Lines when Writing a Memory Array," U.S. patent application Ser. No. 09/897,771; "Memory Device with Row and Column Decoder Circuits Arranged in a Checkerboard Pattern under a Plurality of Memory Arrays," U.S. patent application Ser. No. 09/896,814; "Method and System for Increasing Programming Bandwidth in a Non-Volatile Memory Device," U.S. patent application Ser. No. 09/895,906; "Method and Apparatus for Discharging Memory Array Lines," U.S. patent application Ser. No. 09/897,784; "Current Sensing Method and Apparatus Particularly Useful for a Memory Array of Cells Having Diode-Like Characteristics," U.S. patent application Ser. No. 09/896,468; and "Memory Device and Method for Sensing while Programming a Non-Volatile Memory Cell," U.S. patent application Ser. No. 09/896,815.

What is claimed is:

1. An integrated circuit comprising:

a memory array of memory cells with diode-like conduction characteristics for at least one of two memory cell data states, the array having at least one layer of word lines and at least one layer of bit lines, the bit lines on each bit line layer organized in at least one group;

at least one noise detection line associated with each layer of bit lines;

a selection circuit for selecting one of a group of bit lines, and for selecting a noise detection line associated with the group of bit lines; and a bit line sensing circuit responsive to a signal on the selected bit line and a signal on the selected noise detection line.

2. The invention defined in claim 1 wherein:
each noise detection line is arranged so that memory cells coupled respectively thereto are substantially non-conductive.

3. The invention defined in claim 1 wherein:
memory cells forming each noise detection line are substantially non-conductive.

4. The invention defined in claim 1 wherein:
the bit line sensing circuit comprises a voltage sensing circuit.

5. The invention defined in claim 4 wherein the voltage sensing circuit comprises:
a first precharge circuit for precharging the selected noise detection line to an unselected word line bias voltage; and
a second precharge circuit for precharging the selected bit line to a voltage other than the unselected word line bias voltage.

6. The invention defined in claim 5 wherein:
the second precharge circuit is configured to precharge the selected bit line to ground.

7. The invention defined in claim 1 wherein:
the bit line sensing circuit comprises a current sensing circuit.

8. The invention defined in claim 1 wherein:
the selection circuit is arranged so that a selected bit line is never adjacent to a selected noise detection line.

9. The invention defined in claim 1 wherein:
the selection circuit is arranged so that a selected bit line is never adjacent to another selected bit line.

10. The invention defined in claim 1 wherein:
the selection circuit is arranged so that a selected bit line within a first group of bit lines is never adjacent to a selected bit line within a second group of bit lines.

11. The invention defined in claim 1 wherein the memory cells comprise a semiconductor material.

12. The invention defined in claim 1 wherein the memory cells comprise an organic polymer.

13. The invention defined in claim 1 wherein the memory cells comprise a phase change material.

14. The invention defined in claim 1 wherein the memory cells comprise an amorphous solid.

15. The invention defined in claim 1 wherein the memory cells comprise an anti-fuse layer.

16. The invention defined in claim 1 wherein the memory cells comprise a fuse layer.

17. The invention defined in claim 1 wherein:
the bit lines on each bit line layer are arranged in at least two groups, each group associated with a respective selection circuit and sensing circuit on a respective side of the array.

18. The invention defined in claim 17 wherein:
a single noise detection line is associated with more than one group of bit lines on a bit line layer and is selectable by the respective selection circuit for more than one group.

19. The invention defined in claim 17 wherein:
each respective group of bit lines on a bit line layer is associated with at least one respective noise detection line which is not also associated with at least one other group.

20. The invention defined in claim 17 wherein:
each noise detection line is arranged so that each memory cell coupled respectively thereto is arranged to conduct negligible current when an associated word line is selected.

21. The invention defined in claim 1 wherein:
each group of bit lines on a bit line layer includes a pair of associated noise detection lines.

22. The invention defined in claim 21 wherein:
half the respective memory cells on each noise detection line are arranged to conduct current when a respectively associated word line is selected, and the remaining half of the respective memory cells on each noise detection line are arranged to not conduct significant current when a respectively associated word line is selected.

23. The invention defined in claim 22 wherein:
the memory cells on each noise detection line are programmed during manufacture to provide testing of memory cell programmability.

24. The invention defined in claim 23 wherein:
the memory cells on each noise detection line are write-once programmable memory cells.

25. The invention defined in claim 21 wherein:
for a given word line, the associated memory cell on one but not the other of the pair of noise detection lines associated with a group of bit lines is conductive.

26. The invention defined in claim 25 wherein:
the selection circuit is arranged to select the noise detection line whose memory cell associated with the selected word line is not conductive.

27. The invention defined in claim 17 wherein:
the selection circuit is arranged so that a noise detection line adjacent to a selected bit line is never selected, irrespective of which group of bit lines each is associated with.

28. The invention defined in claim 17 wherein:
the selection circuit is arranged so that a selected bit line is never adjacent to another selected bit line, irrespective of which group of bit lines each is associated with.

29. The invention defined in claim 1 wherein:
the bit lines on each bit line layer are arranged in at least two groups, each group associated with a respective selection circuit and sensing circuit on a respective side of the array; and
each respective group of bit lines on a bit line layer includes a respective pair of noise detection lines exclusively associated with the respective group.

30. The invention defined in claim 29 wherein:
half the respective memory cells on each noise detection line are arranged to conduct current when a respectively associated word line is selected, and the remaining half of the respective memory cells on each noise detection line are arranged to not conduct significant current when a respectively associated word line is selected.

31. An integrated circuit comprising:
a multi-level memory array of programmable anti-fuse memory cells, having at least one layer of word lines and more than one layer of bit lines, the bit lines on each bit line layer organized in at least one group;
at least one noise detection line associated with each layer of bit lines;
a selection circuit for selecting, on a selected layer, one bit line of a group of bit lines, and a noise detection line associated with the group of bit lines; and
a bit line sensing circuit responsive to a signal on the selected noise detection line and a signal on the selected bit line.

32. The invention defined in claim 31 wherein:

memory cells on each noise detection line remain unprogrammed.

33. The invention defined in claim 31 wherein:

the bit line sensing circuit comprises a voltage sensing circuit.

34. The invention defined in claim 31 wherein:

the bit line sensing circuit comprises a current sensing circuit.

35. The invention defined in claim 31 wherein:

the selection circuit is arranged so that a selected bit line on a bit line layer is never adjacent to a selected noise detection line on the same bit line layer.

36. The invention defined in claim 31 wherein:

the selection circuit is arranged so that a selected bit line on a bit line layer is never adjacent to another selected bit line on the same bit line layer.

37. The invention defined in claim 31 wherein:

alternating bit lines on a bit line layer form a first group and are associated with a selection circuit and sensing circuit disposed to one side of the array, and remaining bit lines on the layer form a second group and are associated with a selection circuit and sensing circuit disposed to a side of the array opposite the one side.

38. The invention defined in claim 37 wherein:

each respective group of bit lines on a bit line layer is associated with a respective noise detection line.

39. The invention defined in claim 37 wherein:

memory cells on each noise detection line remain unprogrammed.

40. The invention defined in claim 37 wherein:

the selection circuit is arranged so that a selected bit line is never adjacent to a selected noise detection line, irrespective of which group of bit lines each is associated with.

41. The invention defined in claim 37 wherein:

the selection circuit is arranged so that a selected bit line is never adjacent to another selected bit line, irrespective of which group of bit lines each is associated with.

42. The invention defined in claim 37 further comprising:

more than one selection circuit associated with each group of bit lines.

43. The invention defined in claim 37 wherein:

the memory array is arranged with a word-line layer as the bottom-most layer of the memory array.

44. The invention defined in claim 37 wherein:

more than one noise detection line is associated with each selection circuit and sensing circuit; and a noise detection line nearest to a selected bit line is selected.

45. The invention defined in claim 31 wherein:

each respective group of bit lines on a bit line layer is associated with a respective pair of noise detection lines.

46. The invention defined in claim 45 wherein:

half the memory cells on each noise detection line are programmed, and the remaining half of the memory cells on each noise detection line are unprogrammed.

47. The invention defined in claim 46 wherein:

the programmed memory cells on each noise detection line are programmed during manufacture to test programmability of write-once memory cells.

48. The invention defined in claim 46 wherein:

for a given word line, the associated memory cell on one but not the other of the pair of noise detection lines associated with a group of bit lines is programmed.

49. The invention defined in claim 48 wherein:

the selection circuit is arranged to select the noise detection line whose memory cell associated with the selected word line is unprogrammed.

50. An integrated circuit comprising:

a multi-level memory array of programmable anti-fuse memory cells, having at least one layer of word lines and more than one layer of bit lines;

at least one noise detection line associated with each layer of bit lines;

means for selecting a bit line on a layer and for selecting a noise detection line associated with the selected bit line;

means for comparing a noise current on the selected noise detection line plus a reference current, to a current on the selected bit line comprising a selected memory cell current and a noise current on the selected bit line.

51. The invention defined in claim 50 wherein:

the reference current has a magnitude between a current level corresponding to a programmed memory cell and a current level corresponding to an unprogrammed memory cell.

* * * * *